(12) United States Patent
Yin et al.

(10) Patent No.: US 11,320,521 B2
(45) Date of Patent: May 3, 2022

(54) LIGHT SENSOR AND SENSING METHOD THEREOF COMPRISING A CONTROL CIRCUIT TO OPERATE DIODES OF PLURAL SENSING SUB-PIXELS IN A GEIGER MODE OR IN AN AVALANCHE LINEAR MODE ACCORDING TO INTENSITY OF AMBIENT LIGHT

(71) Applicant: Guangzhou Tyrafos Semiconductor Technologies Co., LTD, Guangzhou (CN)

(72) Inventors: Ping-Hung Yin, Taipei (TW); Jia-Shyang Wang, Miaoli County (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 0 days.

(21) Appl. No.: 17/349,855

(22) Filed: Jun. 16, 2021

(65) Prior Publication Data
US 2022/0011158 A1    Jan. 13, 2022

Related U.S. Application Data

(60) Provisional application No. 63/058,502, filed on Jul. 30, 2020, provisional application No. 63/050,120, filed on Jul. 10, 2020.

(51) Int. Cl.
*H01L 31/107* (2006.01)
*G01S 7/4865* (2020.01)
(Continued)

(52) U.S. Cl.
CPC .............. *G01S 7/4865* (2013.01); *G01J 1/44* (2013.01); *G01S 7/484* (2013.01); *G01S 7/4814* (2013.01); *G01S 7/4816* (2013.01); *G01S 7/4863* (2013.01); *G01S 17/10* (2013.01); *G01S 17/14* (2020.01); *G04F 10/005* (2013.01); *H01L 27/1446* (2013.01); *H01L 31/107* (2013.01); *G01J 2001/442* (2013.01); *G01J 2001/444* (2013.01);
(Continued)

(58) Field of Classification Search
CPC ...... G01S 7/4865; G01S 17/894; G01S 17/89; G01J 1/44; G01J 2001/446; G01J 2001/4466; H01L 27/146; H01L 31/107
USPC ....................................... 250/214 AL, 214 R
See application file for complete search history.

(56) References Cited

U.S. PATENT DOCUMENTS 10,873,738 B2 * 12/2020 Retterath ......... H04N 5/232121

FOREIGN PATENT DOCUMENTS

TW         202025714         7/2020

OTHER PUBLICATIONS

"Office Action of Taiwan Counterpart Application", dated Oct. 28, 2021, p. 1-p. 5.

* cited by examiner

*Primary Examiner* — Que Tan Le
(74) *Attorney, Agent, or Firm* — JCIPRNET

(57) ABSTRACT

A light sensor and a sensing method thereof are provided. The light sensor includes a plurality of sensing sub-pixels and a control circuit. The sensing sub-pixels are arranged in an array to form a sensing array. The control circuit is coupled to the sensing sub-pixels. The control circuit operates a plurality of diodes of the sensing sub-pixels in a photodiode mode to sense intensity of ambient light. The control circuit operates the diodes in a Geiger mode or in an avalanche linear mode according to the intensity of the ambient light.

20 Claims, 7 Drawing Sheets

(51) Int. Cl.
*G01S 7/481* (2006.01)
*G01S 17/10* (2020.01)
*G01S 7/484* (2006.01)
*G01J 1/44* (2006.01)
*G01S 17/14* (2020.01)
*G01S 7/4863* (2020.01)
*G04F 10/00* (2006.01)
*H01L 27/144* (2006.01)

(52) U.S. Cl.
CPC . *G01J 2001/448* (2013.01); *G01J 2001/4466* (2013.01)

LIGHT SENSOR AND SENSING METHOD THEREOF COMPRISING A CONTROL CIRCUIT TO OPERATE DIODES OF PLURAL SENSING SUB-PIXELS IN A GEIGER MODE OR IN AN AVALANCHE LINEAR MODE ACCORDING TO INTENSITY OF AMBIENT LIGHT

CROSS-REFERENCE TO RELATED APPLICATION

This application claims the priority benefit of U.S. provisional application Ser. No. 63/058,502, filed on Jul. 30, 2020 and U.S. provisional application Ser. No. 63/050,120, filed on Jul. 10, 2020. The entirety of each of the above-mentioned patent applications is hereby incorporated by reference herein and made a part of this specification.

BACKGROUND

Technical Field

The disclosure relates to a sensing technology, and in particular, relates to a light sensor and a sensing method thereof.

Description of Related Art

At present, distance measuring sensors featuring high sensitivity are highly demanded in various application fields, such as the medical field or the automotive field. In particular, light sensors that may be used to sense extremely low light are currently the mainstream in sensor design. In view of this, development of a light sensor capable of effectively sensing extremely low light and featuring high accuracy and high reliability is an important issue, and solutions of several embodiments are provided as follows.

SUMMARY

The disclosure provides a light sensor and a sensing method thereof capable of performing distance measuring and sensing by operating diodes in a Geiger mode or in an avalanche linear mode.

The disclosure provides a light sensor including a plurality of sensing sub-pixels and a control circuit. The sensing sub-pixels are arranged in an array to form a sensing array. The control circuit is coupled to the sensing sub-pixels. The control circuit operates a plurality of diodes of the sensing sub-pixels in a photodiode mode to sense intensity of ambient light. Further, the control circuit operates the diodes in a Geiger mode or in an avalanche linear mode according to the intensity of the ambient light.

The disclosure further provides a sensing method suitable for a light sensor. The light sensor includes a plurality of sensing sub-pixels and a control circuit. The sensing method includes the following steps. A plurality of diodes of the sensing sub-pixels are operated in a photodiode mode through the control circuit to sense intensity of ambient light. The diodes are operated in a Geiger mode or in an avalanche linear mode through the control circuit according to the intensity of the ambient light.

To sum up, in the light sensor and the sensing method thereof provided by the disclosure, the diodes may be determined to be operated in the Geiger mode or in the avalanche linear mode according to sensing result of the intensity of the ambient light when the diodes are operated in the photodiode mode, and distance measuring and sensing may thus be effectively performed.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
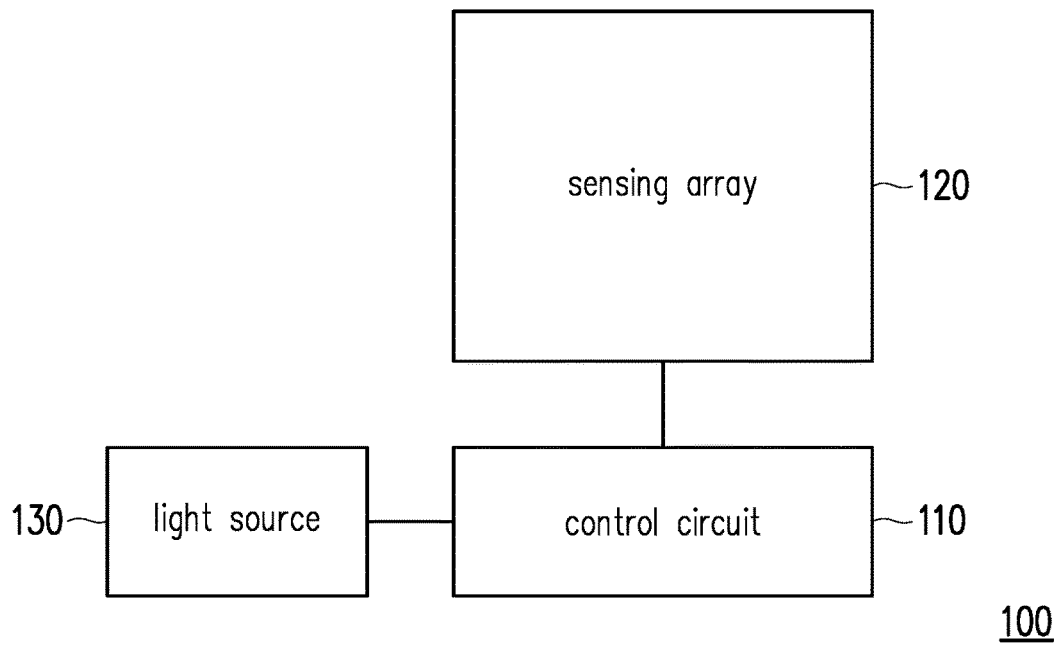
FIG. 1 is a schematic diagram of a structural of a light sensor according to an embodiment of the disclosure.

In order to make the disclosure more comprehensible, several embodiments are described below as examples of implementation of the disclosure. Moreover, elements/components/steps with the same reference numerals are used to represent the same or similar parts in the drawings and embodiments.

Figure 2:
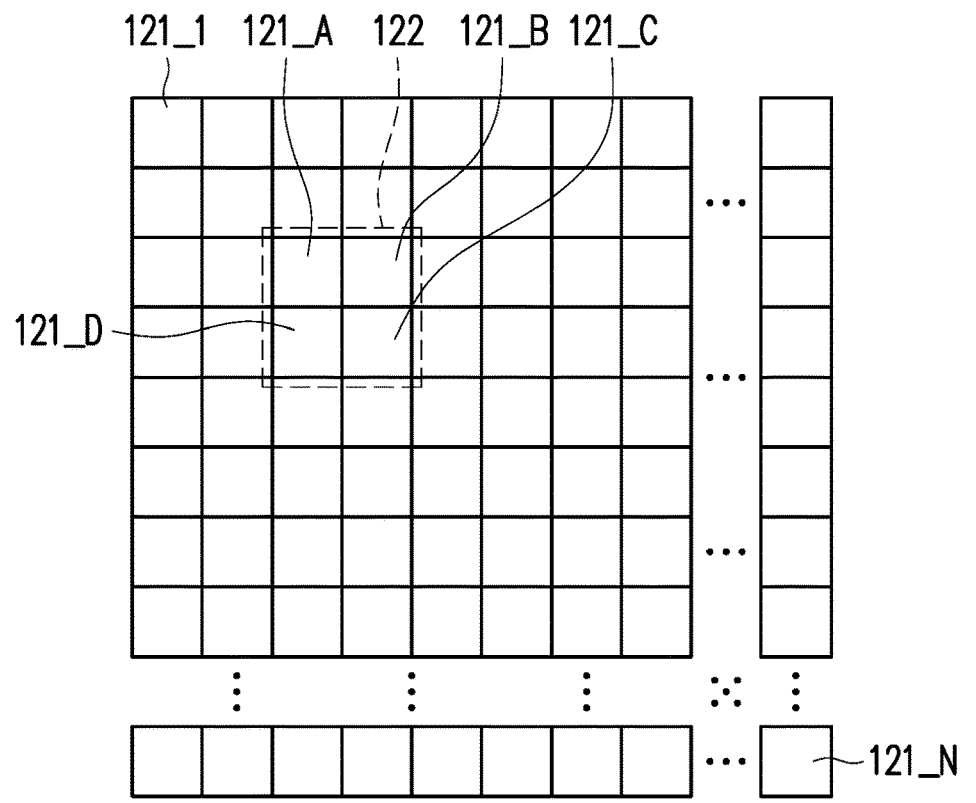
FIG. 2 is a schematic diagram of a sensing array according to an embodiment of the disclosure.

FIG. 1 is a schematic diagram of a structural of a light sensor according to an embodiment of the disclosure. FIG. 2 is a schematic diagram of a sensing array according to an embodiment of the disclosure. With reference to FIG. 1 and FIG. 2, a light sensor 100 includes a control circuit 110, a sensing array 120, and a light source 130. The control circuit 110 is coupled to the sensing array 120 and the light source 130. The sensing array 120 includes a plurality of sensing sub-pixels 121_1 to 121_N, where N is a positive integer. Each of the sensing sub-pixels 121_1 to 121_N includes at least one diode (photodiode). The diode may be a pn junction diode. In this embodiment, the control circuit 110 may control the sensing array 120 to operate the diodes in the sensing sub-pixels 121_1 to 121_N to perform a light sensing operation in a photodiode mode, a Geiger mode, or an avalanche linear mode. In this embodiment, the light source 130 may be an infrared laser light source, but the disclosure is not limited thereto. In some other embodiments of the disclosure, the light source 130 may be a visible light source or an invisible light source. In this embodiment, the control circuit 110 may operates the diodes of the sensing sub-pixels 121_1 to 121_N in the Geiger mode or in a signal-photon avalanche diode (SPAD) state of the avalanche linear mode to sense sensing light emitted by the light source 130, and in this way, a distance measuring and sensing function for a low amount of light with high sensing sensitivity is achieved.

In this embodiment, the control circuit 110 may be, for example, an internal circuit or a chip of the light sensor and includes a digital circuit element and/or an analog circuit element. The control circuit 110 may control operation modes (e.g., an exposure operation, a readout operation, etc.) of the diodes in the sensing sub-pixels 121_1 to 121_N and/or the sensing sub-pixels 121_1 to 121_N through changing bias voltages of the diodes and/or control voltages of a plurality of transistors in the sensing sub-pixels 121_1 to 121_N. The control circuit 110 may control the light source 130 to emit sensing light and perform related signal processing and sensing data calculating to sensing signals outputted by the sensing sub-pixels 121_1 to 121_N. In some other embodiments of the disclosure, the control circuit 110 may also be, for example, an external circuit or a chip of the light sensor or may be a processing circuit or a control circuit such as a central processing unit (CPU), a microprocessor control unit (MCU), or a field programmable gate array (FPGA) of a specific terminal device, but the disclosure is not limited thereto.

Figure 3:
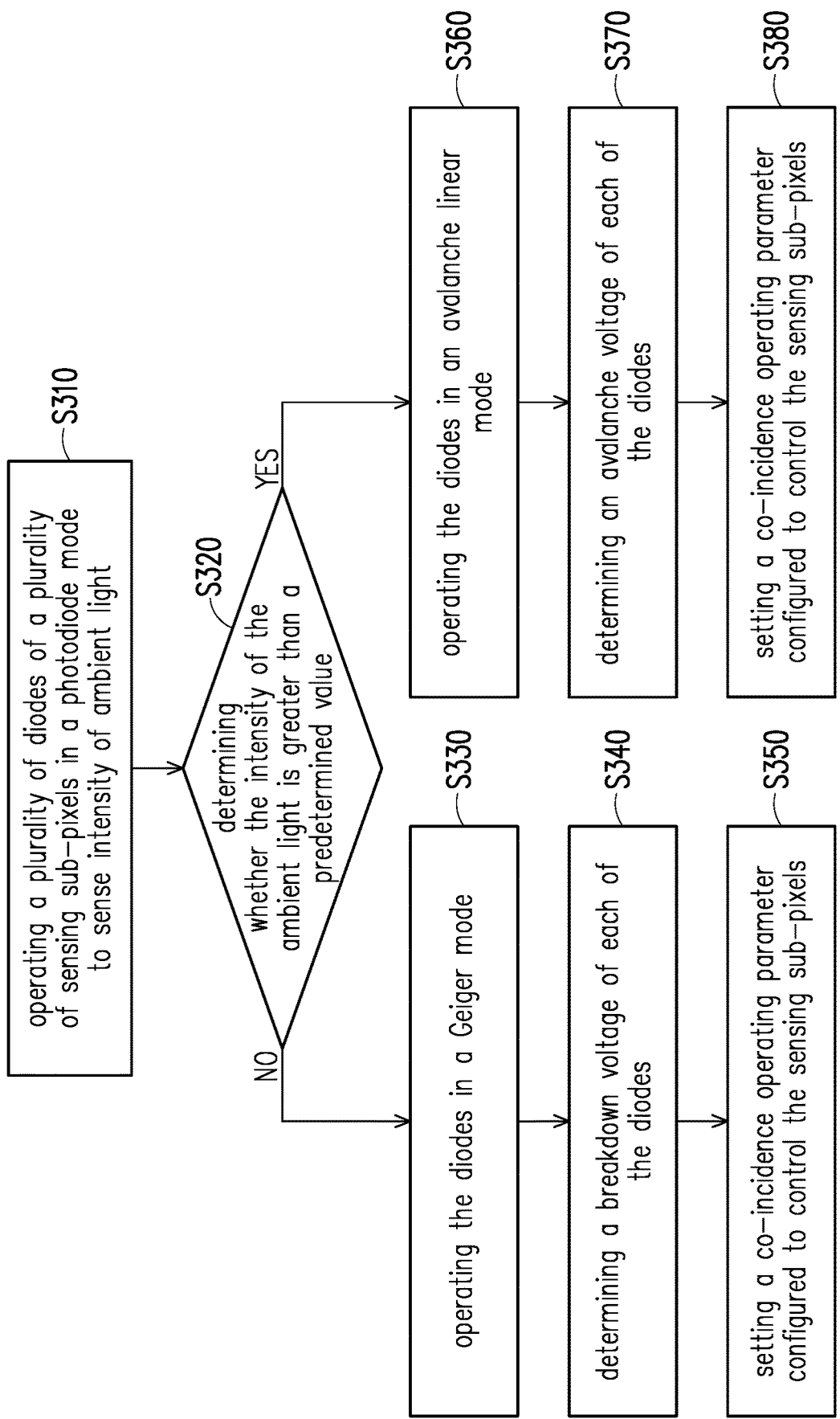
FIG. 3 is a flow chart of a sensing method according to an embodiment of the disclosure.
Figure 4:
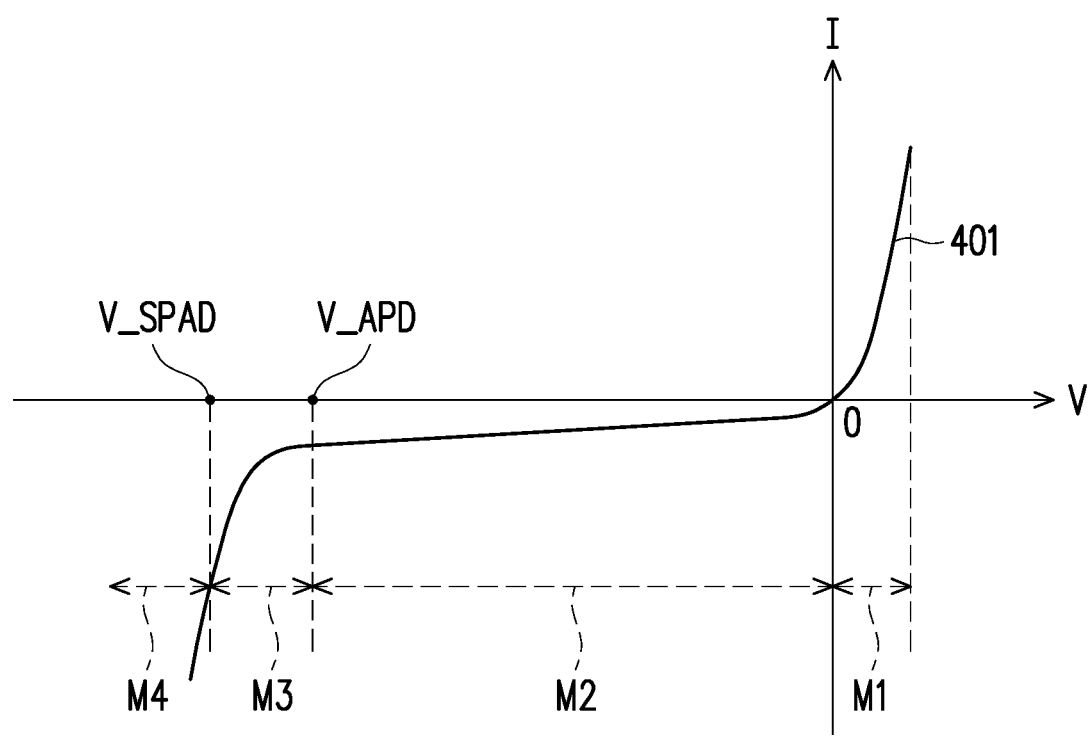
FIG. 4 is a curve graph of characteristics of a diode according to an embodiment of the disclosure.

FIG. 3 is a flow chart of a sensing method according to an embodiment of the disclosure. FIG. 4 is a curve graph of characteristics of a diode according to an embodiment of the disclosure. With reference to FIG. 1 to FIG. 4, the light sensor 100 may perform the following operations S310 to S380. Note that the diode described in this embodiment may exhibit a characteristic curve 401 shown in FIG. 4. In FIG. 4, a horizontal axis is a bias voltage V of the diode, and a vertical axis is a current I that the diode may generate due to photoelectric conversion under the corresponding bias voltage. When the bias voltage V of the diode is greater than 0 (e.g., voltage range M1 shown in FIG. 4), the diode may be operated in a solar cell mode. When the bias voltage V of the diode is between 0 and an avalanche voltage V_APD (e.g., voltage range M2 shown in FIG. 4), the diode may be operated in the photodiode mode. When the bias voltage V of the diode is between the avalanche voltage V_APD and a breakdown voltage V_SPAD (e.g., voltage range M3 shown in FIG. 4), the diode may be operated in the avalanche linear mode (APD mode). When the bias voltage V of the diode is less than the breakdown voltage V_SPAD (voltage range M4 shown in FIG. 4), the diode may be operated in the Geiger mode.

In step S310, the control circuit 110 may operate the sensing sub-pixels 121_1 to 121_N in the photodiode mode to sense intensity of ambient light. In step S320, the control circuit 110 may determine whether the intensity of the ambient light is greater than a predetermined value. If no is determined, it means that the light sensor 100 is currently operated in an environment with less ambient light interference. As such, the light sensor 100 may operate the diodes of the sensing sub-pixels 121_1 to 121_N in a mode having high sensing sensitivity to photons of the sensing light of the light source 130. In step S330, the control circuit 110 may operate the diodes in the sensing sub-pixels 121_1 to 121_N in the Geiger mode. Besides, since the different diodes may have different breakdown voltages, in step S340, the light sensor 100 may determine each breakdown voltage of each of the diodes of each of the sensing sub-pixels 121_1 to 121_N to correct the diodes. In step S350, the light sensor 100 may set a co-incidence operating parameter configured to control the sensing sub-pixels 121_1 to 121_N.

If the control circuit 110 determines the intensity of the ambient light is greater than the predetermined value, it means that the light sensor 100 is currently operated in a bright environment. As such, during a sensing process of the light sensor 100, the diodes may easily receive photons of the ambient light to generate sensing signals. Therefore, in order to improve sensing accuracy, the sensing sensitivity of the light sensor 100 may be lowered. In step S360, the control circuit 110 may operate the diodes of the sensing sub-pixel 121_1 to 121_N in the avalanche linear mode. Besides, since the different diodes may have different avalanche voltages, in step S370, the light sensor 100 may determine each avalanche voltage of each of the diodes of each of the sensing sub-pixels 121_1 to 121_N to correct the diodes. In step S380, the light sensor 100 may set a co-incidence operating parameter configured to control the sensing sub-pixels 121_1 to 121_N.

Note that the co-incidence operating parameter may include at least one of co-incidence work numbers of the diodes, an exposure time length of an exposure time interval, and an exposure starting time of the exposure time interval. In this embodiment, the control circuit 110 may set at least one of the co-incidence work numbers of the diodes, the exposure time length of the exposure time interval, and the exposure starting time of the exposure time interval according to whether the diodes are operated in the Geiger mode or in the avalanche linear mode. To be specific, the control circuit 110 may determine whether a portion of each of the co-incidence work number in each of the diodes synchronously generates a plurality of sensing currents in the corresponding exposure time interval to confirm whether the portion of the co-incidence work number in each of the diodes senses light.

In other words, in this embodiment, the control circuit 110 may set every plurality sensing sub-pixels among the sensing sub-pixels 121_1 to 121_N as one sensing pixel (or referred to as a macro-pixel). With reference to FIG. 1, four sensing sub-pixels 121_A to 121_D may act as one sensing pixel 122. A to D are positive integers less than or equal to N. The control circuit 110 may determine whether each of the sensing sub-pixels 121_A to 121_D senses one or a plurality of photons in the same corresponding exposure time interval to synchronously generate a plurality of sensing currents acting as a pixel sensing result. For instance, the control circuit 110 may treat a distance sensing result (time difference or distance value) of the sensing sub-pixels 121_A to 121_D as one pixel sensing result.

Figure 5:
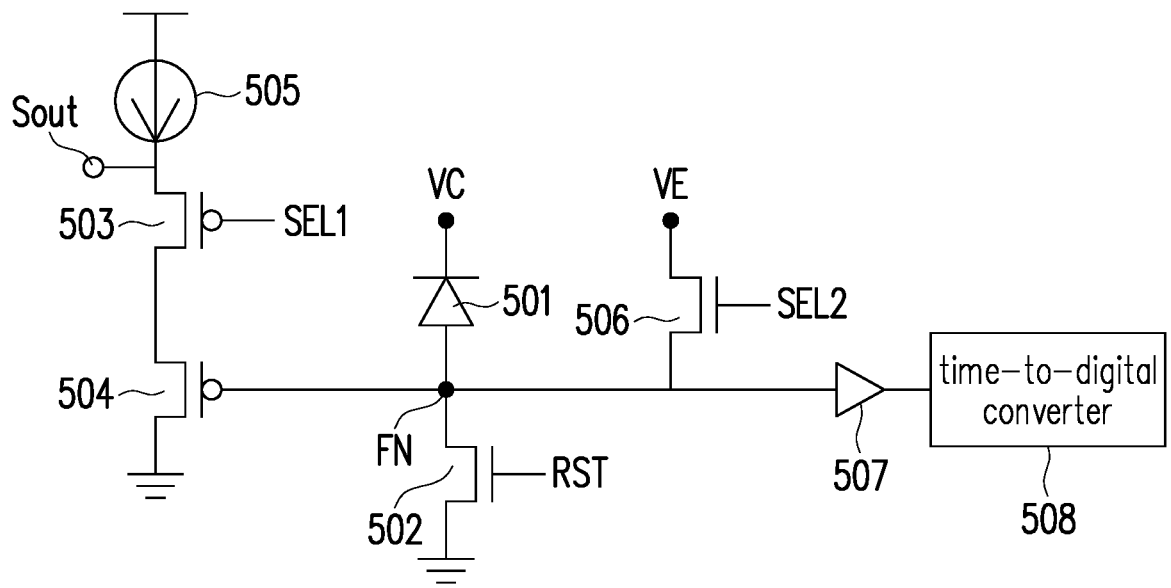
FIG. 5 is a schematic diagram of circuits of a sensing sub-pixel according to an embodiment of the disclosure.

FIG. 5 is a schematic diagram of circuits of a sensing sub-pixel according to an embodiment of the disclosure. With reference to FIG. 5, a sensing sub-pixel 500 provided by this embodiment may be applied to the sensing sub-pixels described in each embodiment of the disclosure. The sensing sub-pixel 500 may include a diode 501, a reset transistor 502, selection transistors 503 and 506, a source follower transistor 504, a reference current source 505, an amplifier 507, and a time-to-digital converter (TDC) 508. In this embodiment, a first terminal (cathode) of the diode 501 is coupled to a reference voltage VC. A first terminal of the reset transistor 502 is coupled to a second terminal (anode) of the diode 501. A control terminal of the reset transistor 502 may receive a reset voltage RST. A control terminal of the source follower transistor 504 is coupled to the second terminal of the diode 501, and a first terminal of the source follower transistor 504 is coupled to a grounding voltage. A first terminal of the selection transistor 503 is coupled to a second terminal of the source follower transistor 504, and a second terminal of the selection transistor 503 is coupled to an output terminal Sout and the reference current source 505. A control terminal of the selection transistor 503 may receive a selection signal SEL1. A first terminal of the selection transistor 506 is coupled to the second terminal of the diode 501, and a second terminal of the selection transistor 506 is coupled to a reference voltage VE. A control terminal of the selection transistor 506 may receive a selection signal SEL2. An input terminal of the amplifier 507 is coupled to the second terminal of the diode 501. The time-to-digital converter 508 is coupled to an output terminal of the amplifier 507. In this embodiment, the reset transistor 502 and the selection transistor 506 may be n-type transistors. The reset transistor 502 and the selection transistor 503 may be p-type transistors.

In this embodiment, the diode 501, the reset transistor 502, the selection transistors 503 and 506, and the source follower transistor 504 may act as three transistors (3T) active pixel sensor (3T-APS) circuits. The output terminal Sout may output a photodiode sensing signal. The diode 501, the reset transistor 502, the selection transistor 506, the amplifier 507, and the time-to-digital converter 508 may act as signal-photon avalanche diode circuits. Note when being operated by the control circuit, the reset transistor 502 not only exhibits a reset function but also acts as a variable resistor. That is, the reset transistor 502 functions as a SPAD quenching circuit. The time-to-digital converter 508 may output a signal-photon avalanche diode sensing signal. In other words, in this embodiment, the sensing sub-pixel 500 is a circuit structure integrating the active pixel sensor with the signal-photon avalanche diode.

In this embodiment, when the control circuit operates the diode 501 in the photodiode mode (controlling the bias voltage of the diode 501), the control circuit may turn off the selection transistor 506. The control circuit may operate or switch the reset transistor 502, the selection transistor 503, and the source follower transistor 504 through a reset signal RST and the selection signal SEL1, so as to perform an exposure operation, a reset operation, and a readout operation of the diode 501. In the readout operation, the control circuit or a signal processing circuit coupled to the output terminal Sout may read out a sensing signal of the diode 501 stored in a floating and diffusing node FN from the output terminal Sout, so as to read out the photodiode sensing signal.

In this embodiment, when the control circuit operates the diode 501 in the Geiger mode or the avalanche linear mode (controlling the bias voltage of the diode 501), the control circuit may turn off the selection transistor 503. The control circuit may operate the selection transistor 506 through the selection signal SEL2. When the sensing sub-pixel 500 is not activated, the selection transistor 506 is turned on, such that a voltage difference between two terminals of the diode 501 is less than the breakdown voltage V_SPAD and the avalanche voltage V_APD, that is, the diode 501 is in a disabled state. When the sensing sub-pixel 500 is activated, the selection transistor 506 is turned on, and the reset transistor 502 resets a voltage of the floating and diffusing node FN, such that the voltage difference between two terminals of the diode 501 is greater than the breakdown voltage V_SPAD or the avalanche voltage V_APD, that is, the diode 501 is in the SPAD state or the APD state. When the diode 501 is operated in the Geiger mode or the avalanche linear mode, the diode 501 receives one photon or a plurality of photons (slight amount), and a current may thus be generated. Further, when the reset transistor 502 (quenching circuit) is operated in a variable resistor state, after the current passes through the reset transistor 502, a voltage signal may be generated. After being amplified to rail-to-rail swing by the amplifier 507, the voltage signal is then provided to the time-to-digital converter 508. In this way, the time-to-digital converter 508 may output a code of the distance sensing result, such as an analog to digital converter code (ADC code), according to a time difference between emitting time of the sensing light emitted by the light source and time when the sensing signal is read by the time-to-digital converter 508.

Figure 6:
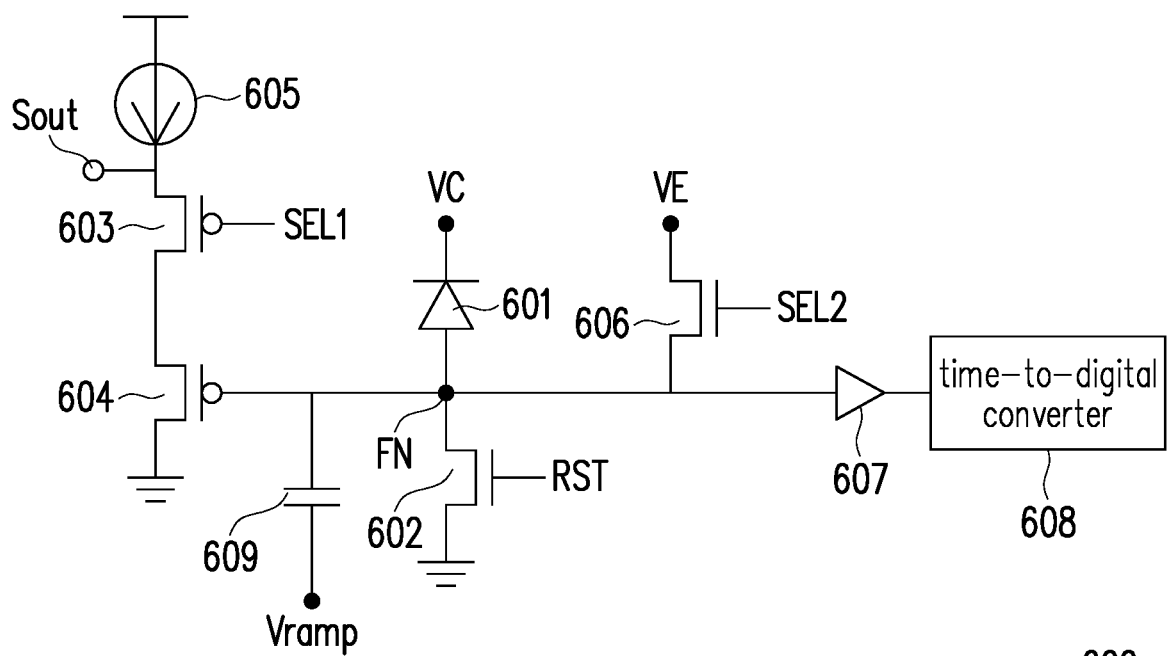
FIG. 6 is a schematic diagram of circuits of a sensing sub-pixel according to another embodiment of the disclosure.

FIG. 6 is a schematic diagram of circuits of a sensing sub-pixel according to another embodiment of the disclosure. With reference to FIG. 6, a sensing sub-pixel 600 provided by this embodiment may be applied to the sensing sub-pixels described in each embodiment of the disclosure. The sensing sub-pixel 600 may include a diode 601, a reset transistor 602, selection transistors 603 and 606, a source follower transistor 604, a reference current source 605, an amplifier 607, a time-to-digital converter 609, and a ramp capacitor 609. In this embodiment, circuit coupling relationships among and implementation of the diode 601, the reset transistor 602, the selection transistors 603 and 606, the source follower transistor 604, the reference current source 605, the amplifier 607, and the time-to-digital converter 608 may be found with reference to the embodiments of FIG. 5, and repeated description is not provided herein. In this embodiment, a first terminal of the ramp capacitor 609 is coupled to a second terminal of the diode 601. In this embodiment, when the diode 601 is operated in the photodiode mode, a second terminal of the ramp capacitor 609 may receive a ramp signal Vramp. To be specific, the diode 601 and another diode of another sensing sub-pixel may form a differential output to improve signal resolution of an image sensing output result. For instance, the diode 601 may receive a ramp-up signal, and the another diode may receive a ramp-down signal. As such, in the two sensing signals of the diode 601 and the another diode of the another sensing sub-pixel, the ramp signals may be overlapped and outputted to a differential analog to digital converter (ADC).

Figure 7A:
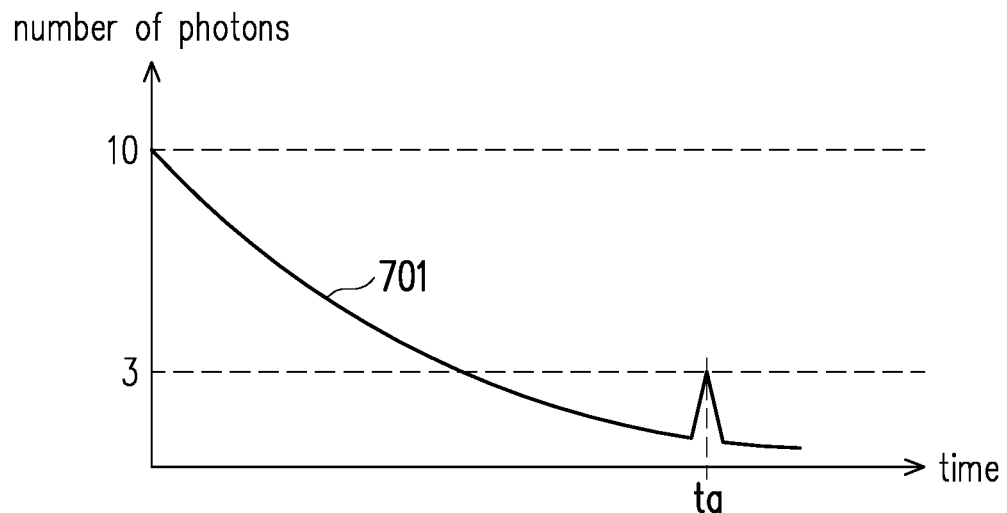
FIG. 7A is a schematic graph of a signal waveform curve of a sensing signal according to an embodiment of the disclosure.
Figure 7B:
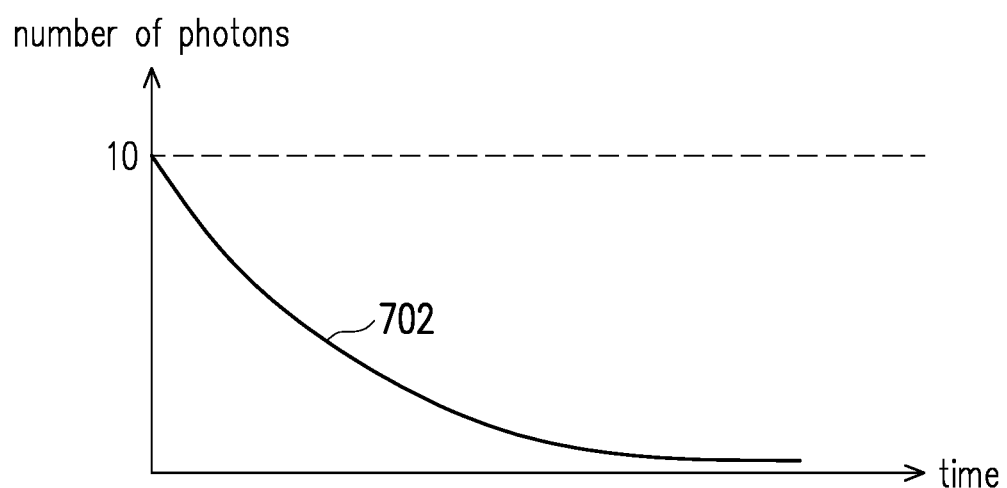
FIG. 7B is a schematic graph of a reference signal waveform curve according to an embodiment of the disclosure.
Figure 7C:
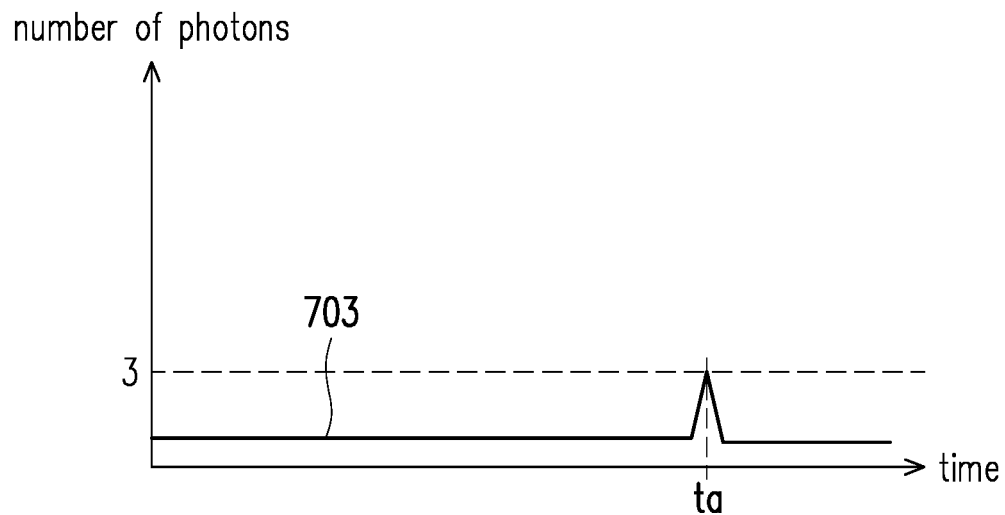
FIG. 7C is a schematic graph of a corrected signal waveform curve according to an embodiment of the disclosure.

FIG. 7A is a schematic graph of a signal waveform curve of a sensing signal according to an embodiment of the disclosure. FIG. 7B is a schematic graph of a reference signal waveform curve according to an embodiment of the disclosure. FIG. 7C is a schematic graph of a corrected signal waveform curve according to an embodiment of the disclosure. With reference to FIG. 1, FIG. 2, and FIG. 7A to FIG. 7C, in this embodiment, the control circuit 110 may perform correction to each one of the sensing sub-pixels 121_1 to 121_N. When the diodes of the sensing sub-pixels 121_1 to 121_N are operated in the Geiger mode or in the avalanche linear mode, the control circuit 101 may establish a signal waveform curve shown in FIG. 7A according to the sensing signal provided by each of the diodes of the sensing sub-pixels 121_1 to 121_N in a sensing period. Note that the signal waveform curve provided by this embodiment may also be presented in a form of histogram data.

For instance, since the diodes are operated in the Geiger mode or in the avalanche linear mode, a signal waveform curve 701 of the sensing signals may have a corresponding sensing result regarding the number of photons corresponding to the sensing light during time ta. However, the diodes operated in the Geiger mode or in the avalanche linear mode may be easily affected by the ambient light or background light. As such, if the control circuit 110 determines whether the sensing light is received according to the sensing result of whether the signal waveform curve 701 exceeds 3 photons, an influence caused by the ambient light or the background light on the signal waveform curve 701 is greater than or equal to 3 photons (signal intensity corresponding to the ambient light or the background light is up to, for example, 10 photons). Accordingly, the control circuit 110 may establish a reference signal waveform curve 702 as shown in FIG. 7B according to another sensing signal provided by each of the diodes when the light source 130 does not emit the sensing light during another sensing period. The control circuit 110 may compare the signal waveform curve 701 in FIG. 7A to the reference signal waveform curve 702 in FIG. 7B. The control circuit 110 may perform numerical subtraction to the signal waveform curve 701 and the reference signal waveform curve 702 to generate a corrected signal waveform curve 703 as shown in FIG. 7C. Therefore, the control circuit 110 may analyze the signal waveform curve 703 to determine a curve change of the sensing result of the signal waveform curve 703 being greater than or equal to 3 photons during the time ta, so as to determine that the sensing light is received. Therefore, since signal waveform correction may be processed for each of the sensing sub-pixels 121_1 to 121_N, the light sensor 100 in this embodiment may effectively confirm whether each of the diodes senses the sensing light emitted from the light source 130.

Nevertheless, in other embodiments of the disclosure, the control circuit 110 may also calculate a portion corresponding to a background sensing signal in the sensing signal according to a value distribution (such as the signal waveform curve 701) of each of the diodes to generate the reference signal waveform curve 702. Note that a Poisson distribution may be adopted for the above calculation. To be specific, since a waveform curve of the background sensing signal is a type of the Poisson distribution, the control circuit 110 may calculate the value distribution of the signal waveform curve 701 according to the Poisson distribution to obtain the reference signal waveform curve 702 of the portion corresponding to the background sensing signal in the sensing signal. Further, the control circuit 110 may perform numerical subtraction to the signal waveform curve 701 and the reference signal waveform curve 702 calculated through the Poisson distribution, and the signal waveform curve 703 may thus be obtained.

Figure 7D:
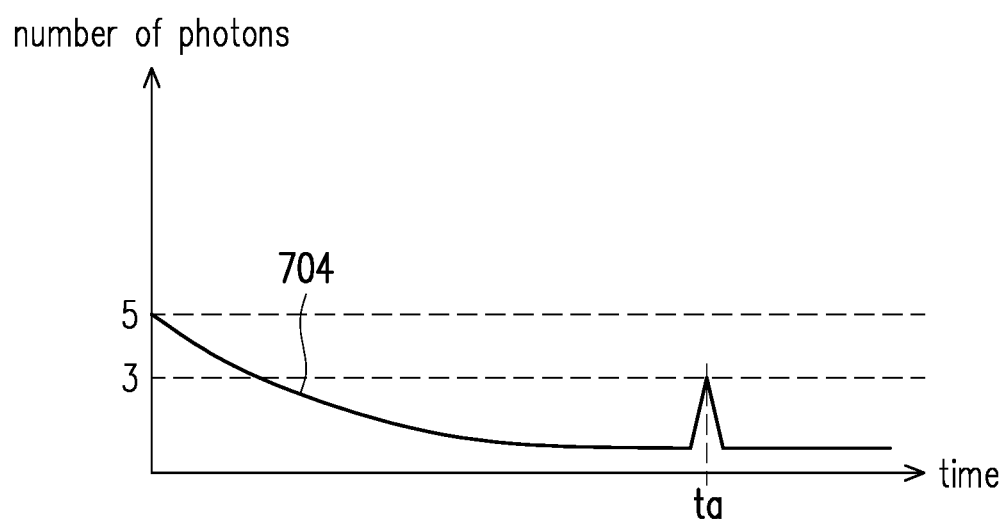
FIG. 7D is a schematic graph of a signal waveform curve of a sensing signal according to another embodiment of the disclosure.

FIG. 7D is a schematic graph of a signal waveform curve of a sensing signal according to another embodiment of the disclosure. With reference to FIG. 1, FIG. 2, and FIG. 7D, in some other embodiments of the disclosure, the sensing light emitted by the light source 130 may have first polarization (e.g., vertical polarization or horizontal polarization). Each of the sensing sub-pixels 121_1 to 121_N may include a filter having the first polarization, so that the diodes of the sensing sub-pixels 121_1 to 121_N may receive light rays having the first polarization only. Therefore, the control circuit 110 may sense the sensing signal provided by each of the diodes of the sensing sub-pixels 121_1 to 121_N in the sensing period to establish a signal waveform curve 704. In this regard, because the ambient light or the background light may be unpolarized, the signal intensity corresponding to the sensing result of the background light or the ambient light in the signal waveform curve 704 may be reduced (the signal intensity corresponding to the ambient light or the background light is, for example 5 photons). In this way, the signal intensity of a portion of the signal waveform curve 704 corresponding to the ambient light or the background light is reduced. Conversely, in the signal waveform curve 704, the signal intensity of the sensing result corresponding to the time ta is increased. Therefore, based on the signal waveform curve 704, the control circuit 110 may easily perform signal analysis so as to effectively obtain the sensing result during the time ta.

Figure 8:
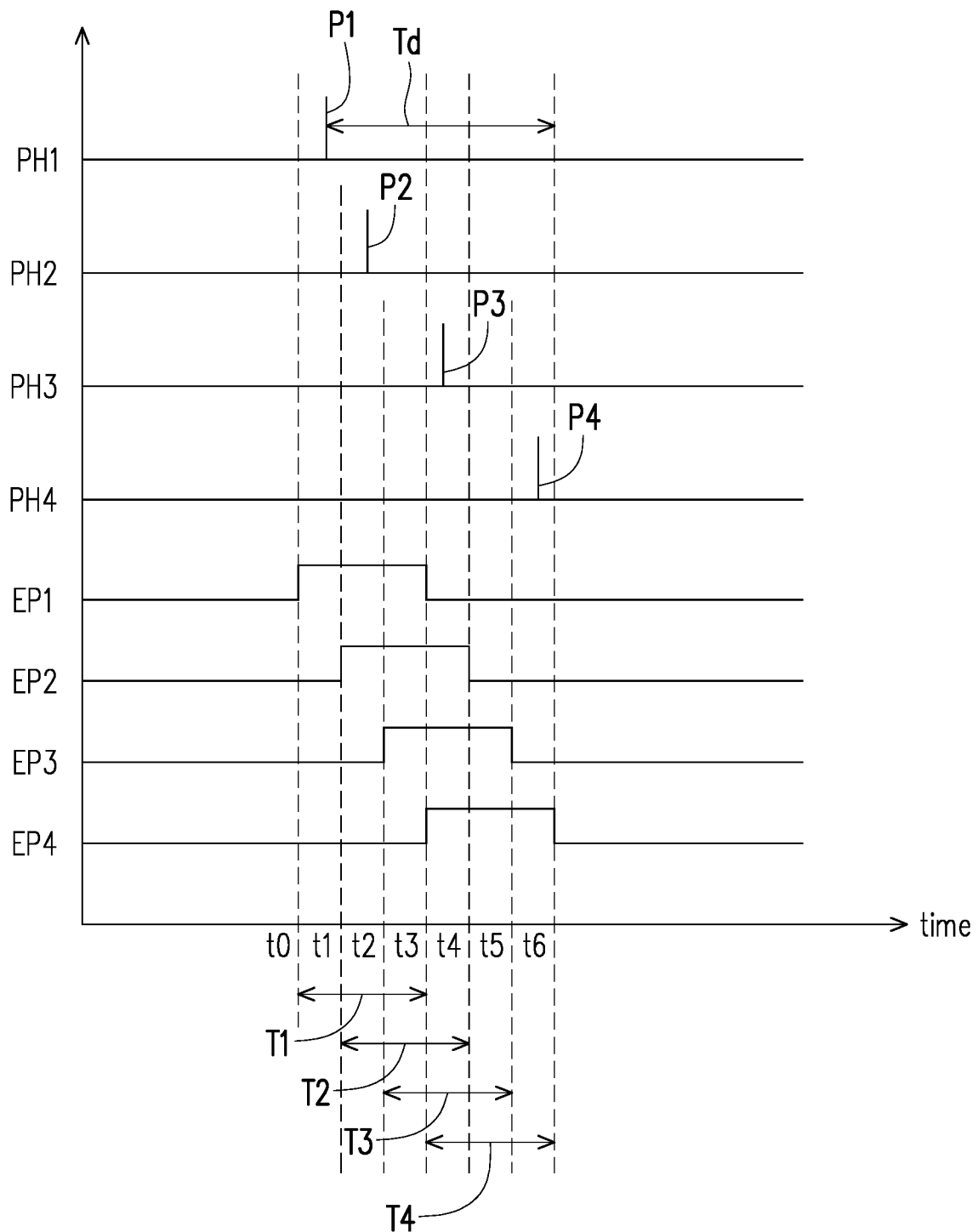
FIG. 8 is an operating sequence diagram of the light sensor according to an embodiment of the disclosure.

FIG. 8 is an operating sequence diagram of the light sensor according to an embodiment of the disclosure. With reference to FIG. 1, FIG. 2, and FIG. 8, note that the diodes of the sensing sub-pixels 121_1 to 121_N act as signal-photon avalanche diodes (when being operated in the Geiger mode or the avalanche linear mode). Therefore, when the diodes sense photons and an avalanche event occurs, the sensing sub-pixels 121_1 to 121_N must re-bias the diodes, so there is a period of time when the photons cannot be sensed (may be referred to as dead time). In this regard, in order to reduce the influence caused by the dead time, in this embodiment, the control circuit 110 may set every plurality sensing sub-pixels among the sensing sub-pixels 121_1 to 121_N to act as one sensing sub-pixel. With reference to FIG. 1, four sensing sub-pixels 121_A to 121_D may act as one sensing pixel 122.

When the four diodes of the sensing sub-pixels 121_A to 121_D are operated in the Geiger mode or the avalanche linear mode, the control circuit 110 may sequentially expose the sensing sub-pixels 121_A to 121_D belonging to the same pixel during a frame sensing period from time t0 to time t6. Regarding emission sequences PH1 to PH4 of the sensing light as shown in FIG. 8, during time t0 to time t6, four sensing light signals (photons) P1 to P4 are emitted to the sensing pixel 122. Regarding exposure operating sequences EP1 to EP4 shown in FIG. 8, when the sensing sub-pixel 121_1 receives the sensing light signal P1 during the time t1 during an exposure period T1, the sensing sub-pixel 121_1 may perform a next exposure operation only after delay time Td passes. In this regard, if exposure periods T2 to T4 of the sensing sub-pixels 121_2 to 121_4 are identical to the exposure period T1, the sensing sub-pixels 121_1 to 121_4 may receive the sensing light signal P1 only. The sensing light signals P2 to P4 may not be sensed because the sensing sub-pixels 121_1 to 121_4 are in the dead time.

Therefore, in this embodiment, exposure starting time of the sensing sub-pixels 121_2 to 121_4 during the exposure periods T2 to T4 may be sequentially delayed to the time t1 to t3 respectively. Sequentially adjacent two exposure periods among the exposure periods T1 to T4 may partially overlap. In this way, the sensing sub-pixel 121_2 may receive the sensing light signal P2 between the time t1 and time t2 during the exposure period T2. The sensing sub-pixel 121_3 may receive the sensing light signal P3 between the time t3 and time t4 during the exposure period T3. The sensing sub-pixel 121_4 may receive the sensing light signal P4 between the time t5 and time t6 during the exposure period T4. Therefore, the sensing sub-pixels 121_2 to 121_4 may effectively receive all of the sensing light signals P1 to P4 and provide an accurate sensing result.

In view of the foregoing, in the light sensor and the sensing method thereof provided by the disclosure, the breakdown voltages or the avalanche voltages of the diodes may be corrected according to the sensing result of the intensity of the ambient light when the diodes are operated in the photodiode mode. In this way, the diodes may be effectively operated in the Geiger mode or in the avalanche linear mode for distance measuring and sensing. Moreover, in the light sensor and the sensing method thereof provided by the disclosure, at least one of the co-incidence work numbers of the diodes, the exposure time length of the exposure time interval, and the exposure starting time of the exposure time interval may be set, and a favorable distance measuring and sensing result is thereby provided.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A light sensor, comprising:
    a plurality of sensing sub-pixels, arranged in an array to form a sensing array; and
    a control circuit, coupled to the sensing sub-pixels,
    wherein the control circuit operates a plurality of diodes of the sensing sub-pixels in a photodiode mode to sense intensity of ambient light, and the control circuit operates the diodes in a Geiger mode or in an avalanche linear mode according to the intensity of the ambient light.

2. The light sensor according to claim 1, wherein the control circuit determines a breakdown voltage of each of the diodes to correct the diodes when the control circuit operates the diodes in the Geiger mode,
    wherein the control circuit determines an avalanche voltage of each of the diodes to correct the diodes when the control circuit operates the diodes in the avalanche linear mode.

3. The light sensor according to claim 2, wherein the control circuit sets at least one of co-incidence work numbers of the diodes, an exposure time length of an exposure time interval, and an exposure starting time of the exposure time interval according to whether the diodes are operated in the Geiger mode or in the avalanche linear mode, wherein the control circuit determines whether a portion of the co-incidence work number in each of the diodes synchronously generates a plurality of sensing currents in the exposure time interval to confirm whether the portion of the co-incidence work number in each of the diodes senses light.

4. The light sensor according to claim 1, wherein each of the sensing sub-pixels comprises:
    the diode, wherein a first terminal of the diode is coupled to a first reference voltage;
    a reset transistor, wherein a first terminal of the reset transistor is coupled to a second terminal of the diode;
    a source follower transistor, wherein a control terminal of the source follower transistor is coupled to the second terminal of the diode, and a first terminal of the source follower transistor is coupled to a grounding voltage;
    a first selection transistor, wherein a first terminal of the first selection transistor is coupled to a second terminal of the source follower transistor, and a second terminal of the first selection transistor is coupled to an output terminal;
    a second selection transistor, wherein a first terminal of the second selection transistor is coupled to the second terminal of the diode, and a second terminal of the second selection transistor is coupled to a second reference voltage;
    an amplifier, wherein an input terminal of the amplifier is coupled to the second terminal of the diode; and
    a time-to-digital converter, coupled to an output terminal of the amplifier.

5. The light sensor according to claim 4, wherein the control circuit turns off the second selection transistor and operates the reset transistor, the source follower transistor, and the first selection transistor to read out a photodiode sensing signal when the diodes are operated in the photodiode mode,
    wherein the control circuit turns off the source follower transistor and operates the second selection transistor when the diodes are operated in the Geiger mode or in the avalanche linear mode, such that the time-to-digital converter outputs a signal-photon avalanche diode sensing signal.

6. The light sensor according to claim 4, wherein each of the sensing sub-pixels further comprises:
    a ramp capacitor, wherein a first terminal of the ramp capacitor is coupled to the second terminal of the diode, and a second terminal of the ramp capacitor is coupled to a ramp signal.

7. The light sensor according to claim 6, wherein every two of the sensing sub-pixels form a differential output when the diodes are operated in the photodiode mode, and the second terminals of the ramp capacitors of every two of the sensing sub-pixels are coupled to a ramp-up signal and a ramp-down signal.

8. The light sensor according to claim 1, wherein the control circuit establishes a signal waveform curve according to a sensing signal provided by each of the diodes in a sensing period when the diodes are operated in the Geiger mode or in the avalanche linear mode, and the control circuit compares the signal waveform curve with a reference signal waveform curve to confirm whether each of the diodes senses sensing light emitted by a light source.

9. The light sensor according to claim 8, wherein the control circuit calculates a value distribution of the signal waveform curve according to a Poisson distribution to obtain the reference signal waveform curve of a portion corresponding to a background sensing signal in the sensing signal.

10. The light sensor according to claim 8, wherein the reference signal waveform curve is established by the control circuit according to another sensing signal provided by each of the diodes when the light source does not emit the sensing light.

11. The light sensor according to claim 1, further comprising:
    a light source, coupled to the control circuit, configured to emit sensing light having first polarization,
    wherein each of the diodes has a filter having the first polarization and is configured to receive reflected light corresponding to the sensing light.

12. The light sensor according to claim 1, wherein at least part of the sensing sub-pixels belonging to a same pixel among the sensing sub-pixels are sequentially exposed during a frame sensing period when the diodes are operated in the Geiger mode or the avalanche linear mode.

13. The light sensor according to claim 1, wherein a plurality of exposure periods of at least part of the sensing sub-pixels belonging to a same pixel among the sensing sub-pixels partially overlap.

14. A sensing method, suitable for a light sensor, wherein the light sensor comprises a plurality of sensing sub-pixels and a control circuit, and the sensing method comprises:
    operating a plurality of diodes of the sensing sub-pixels in a photodiode mode by the control circuit to sense intensity of ambient light; and
    operating the diodes in a Geiger mode or in an avalanche linear mode by the control circuit according to the intensity of the ambient light.

15. The sensing method according to claim 14, further comprising:

determining a breakdown voltage of each of the diodes to correct the diodes by the control circuit when the control circuit operates the diodes in the Geiger mode; and determining an avalanche voltage of each of the diodes to correct the diodes by the control circuit when the control circuit operates the diodes in the avalanche linear mode.

16. The sensing method according to claim 15, further comprising:

setting at least one of co-incidence work numbers of the diodes, an exposure time length of an exposure time interval, and an exposure starting time of the exposure time interval by the control circuit according to whether the diodes are operated in the Geiger mode or in the avalanche linear mode, wherein the control circuit determines whether a portion of the co-incidence work number in each of the diodes synchronously generates a plurality of sensing currents in the exposure time interval to confirm whether the portion of the co-incidence work number in each of the diodes senses light.

17. The sensing method according to claim 14, further comprising:

establishing a signal waveform curve according to a sensing signal provided by each of the diodes in a sensing period by the control circuit when the diodes are operated in the Geiger mode or in the avalanche linear mode; and comparing the signal waveform curve with a reference signal waveform curve by the control circuit to confirm whether each of the diodes senses sensing light emitted by a light source.

18. The sensing method according to claim 14, wherein the light sensor further comprises a light source configured to emit sensing light having first polarization, and each of the diodes has a filter having the first polarization, wherein the diodes are configured to receive reflected light corresponding to the sensing light.

19. The sensing method according to claim 14, further comprising:

at least part of the sensing sub-pixels belonging to a same pixel among the sensing sub-pixels are sequentially exposed during a frame sensing period when the diodes are operated in the Geiger mode or the avalanche linear mode.

20. The sensing method according to claim 19, wherein a plurality of exposure periods of at least part of the sensing sub-pixels belonging to a same pixel among the sensing sub-pixels partially overlap.

* * * * *